United States Patent [19]

Nicholas

[11] 4,037,163
[45] July 19, 1977

[54] AUTOMATIC GAIN CONTROL CIRCUIT

[75] Inventor: John F. Nicholas, Liverpool, N.Y.

[73] Assignee: General Electric Company, Syracuse, N.Y.

[21] Appl. No.: 664,566

[22] Filed: Mar. 8, 1976

[51] Int. Cl.² .................. H04B 1/16; H03B 3/02; H03K 3/00

[52] U.S. Cl. .................. 328/175; 307/237; 307/264; 325/404; 328/151; 328/168; 343/7 AG; 330/136; 330/139

[58] Field of Search .......... 307/230, 237, 264; 328/151, 168, 169, 172, 173, 175; 343/7 AG; 325/400, 404, 407; 330/136, 139

[56] References Cited
U.S. PATENT DOCUMENTS

| | | | |
|---|---|---|---|
| 3,196,355 | 7/1965 | Berry et al. | 325/407 |
| 3,206,689 | 9/1965 | Santana | 307/264 |
| 3,331,030 | 7/1967 | Jordan, Jr. et al. | 325/407 |
| 3,409,834 | 11/1968 | Cullis et al. | 328/169 |
| 3,794,921 | 2/1974 | Unkauf | 343/7 AG |
| 3,835,392 | 9/1974 | Mahner et al. | 325/404 |
| 3,895,299 | 7/1975 | Tiedeman, Jr. | 325/400 |

*Primary Examiner*—Stanley D. Miller, Jr.
*Attorney, Agent, or Firm*—Carl W. Baker; Joseph B. Forman; Frank L. Neuhauser

[57] ABSTRACT

This disclosure is directed to an Automatic Gain Control (AGC) circuit wherein the AGC loop which generates the gain control signal is separate from and not closed through the amplifier whose gain is controlled. Such arrangement permits design of the AGC loop to follow a sampled data reference signal and yet have a response time much shorter than the period between samples.

3 Claims, 4 Drawing Figures

AUTOMATIC GAIN CONTROL CIRCUIT

The Government has rights in this invention pursuant to contract N00039-72-C-0356 awarded by the Department of the Navy.

BACKGROUND OF THE INVENTION

This invention relates to Automatic Gain Control (AGC) circuitry and more specifically to AGC circuitry having particular utility in pulse radar systems.

The design of automatic gain control circuitry for pulse radar systems is greatly complicated by conflicting requirements which the AGC must meet in this particular application. The problem become especially acute where the radar receiver gain is to be controlled by sampling the received signal through only a very brief portion of the pulse repetition period or of some submultiple of that period, and complete loop correction is to be accomplished in the inter-pulse period. In a typical radar system employing this sampling technique, for example, the background noise in the receiver IF channel may be sampled for about 10 microseconds of the "no target" portion of the inter-pulse period, thereby assuring that receiver gain is controlled substantially wholly by background noise and that the target signal returns themselves do not affect amplifier gain as of course would not be desired.

Because the pulse repetition period is itself short, commonly of the order of 50 milliseconds, the sampling period must be kept very short and as previously indicated may be of the order of 10 microseconds. The AGC loop must have relatively high gain, so as to be able to complete any correction indicated to be necessary by the sampled signal within perhaps 30 microseconds after the sample is taken. This in turn requires that the AGC loop have a relatively very short time constant and, consequently relatively very high bandwidth. For loop stability, however, the loop bandwidth should be relatively very narrow, substantially less than the sampling frequency which in this case is the radar pulse repetition frequency or a submultiple thereof. Thus there arises a severe conflict between those requirements of the AGC loop necessary to achieve the desired system gain control characteristic and those essential to loop stability.

The present invention is directed to the provision of automatic gain control circuitry which is capable of satisfying the conflicting requirement of a loop response time that is very short as compared with the time between samples. It is also an objective of the invention to provide automatic gain control circuitry for pulse radar system applications in which the AGC loop is separate from and not closed through the controlled-gain amplifier itself, thus enabling loop operation with sampling rate periods much greater than the loop time constants yet without loop instability. The provision of such separate AGC loop also is of advantage in enabling control of gain of more than a single amplifier channel, as may be advantageous with multichannel IF amplifiers.

SUMMARY OF THE INVENTION

In its preferred implementation the invention utilizes a pair of matched detectors one of which detects a reference signal output from the controlled-gain or AGC amplifier, and the other detects the input IF signal. The latter signal is sampled and stored as a DC voltage, then compared in a difference amplifier with the voltage output of the reference signal detector. This difference signal constitutes a gain error signal and is fed back to control the gain of the AGC amplifier, thus completing the AGC loop. The difference signal also is inverted and applied as the control input to another controlled-gain amplifier, identical with the AGC amplifier, interposed in the main IF signal channel. The gain of this main channel amplifier thus is controlled in inverse relation to the sampled and held IF signal input to the AGC loop. Gain control in this manner holds the background noise level in the main IF signal channel at essentially constant level, as is desirable for purposes of target visibility against that background.

BRIEF DESCRIPTIONS OF DRAWINGS

DESCRIPTION OF THE PREFERRED EMBODIMENT

Figure 1:
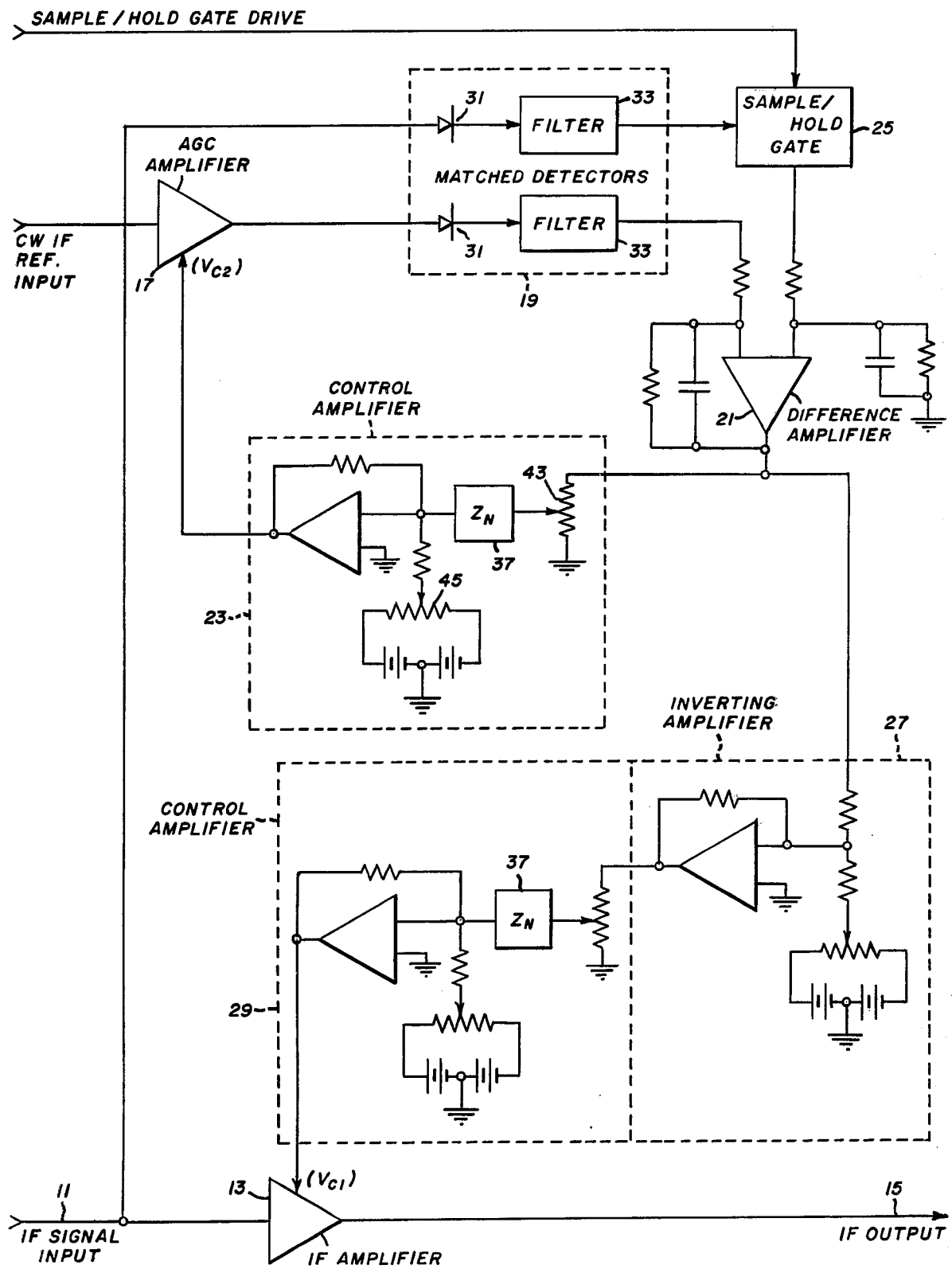
FIG. 1 is a block diagram of a controlled-gain amplifier and associated AGC loop in accordance with the invention.

With continued reference to the drawings, the IF signal input to the controlled-gain amplifier in FIG. 1 is applied via lead 11 to the intermediate frequency (IF) amplifier 13. The gain of that amplifier is adjustable in response to a control voltage (Vc1), and the IF output of the amplifier is applied via lead 15 to subsequent IF or detector stages of the receiver (not shown). The control voltage input to IF amplifier 13 is generated by an AGC loop which includes the other circuit elements shown in FIG. 1 as now to be described.

As previously mentioned it frequently is desired, in pulse radar system of the kind to which the present invention has primary application, to have the AGC for the receiver IF stages operate in response to a receiver input which is time-sampled during the no-target or background noise portion of the pulse repetition period or some submultiple of that period. If the AGC control voltage is derived in conventional manner, by including a controlled-gain amplifier in the sampled-signal loop or, in this case, the sampled-noise loop, and closing the AGC loop through that amplifier, it becomes necessary to hold the loop bandwidth to less than one half the sampling rate frequency to insure loop stability. This results in a problem of conflicting requirements when a high bandwidth is necessary for full gain correction to be achieved a short time after each sample is taken.

In accordance with the invention, these difficulties are avoided by removal of the controlled-gain amplifier from the sampled-noise channel and instead placing that amplifier in a separate control loop which is always closed and into which the sampled noise is supplied as a reference or an offset input. Thus, as shown in FIG. 1, the AGC loop comprises an AGC amplifier 17, one of a pair of matched detectors 19, a difference amplifier 21, and a control amplifier 23. The sampled-noise input to this AGC loop is through the second of the two matched detectors 19, a sample-hold gate 25, and the second of the two inputs to difference amplifier 21.

The difference amplifier output is applied through control amplifier 23 directly as the AGC control voltage Vc2, and after inversion in inverting amplifier 27 it is applied through control amplifier 29 as the control voltage Vc1 to the main IF amplifier 11 to thereby control its gain. The net effect is to adjust the gain of this amplifier as necessary to maintain the desired essentially constant level of the sampled-noise signal, and thus of background noise, in the main IF channel.

Figure 3:
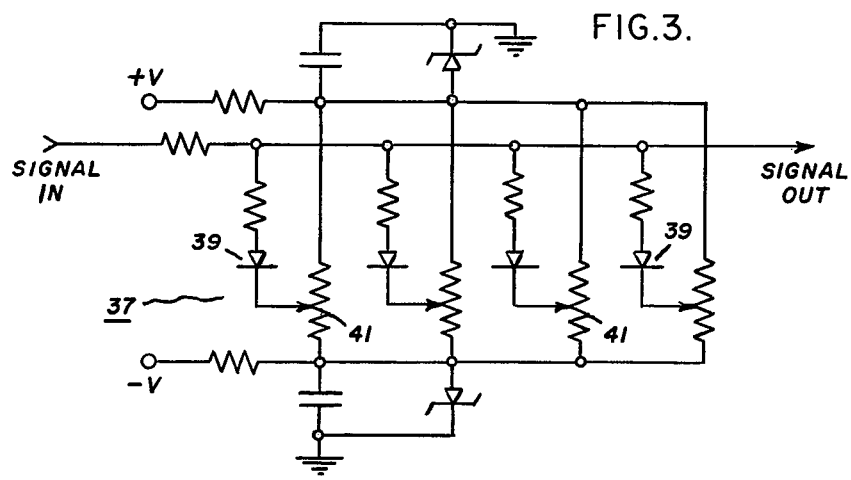
FIG. 3 is an elementary circuit diagram of a linearizing network useful in the AGC circuit of FIG. 1.
Figure 4:
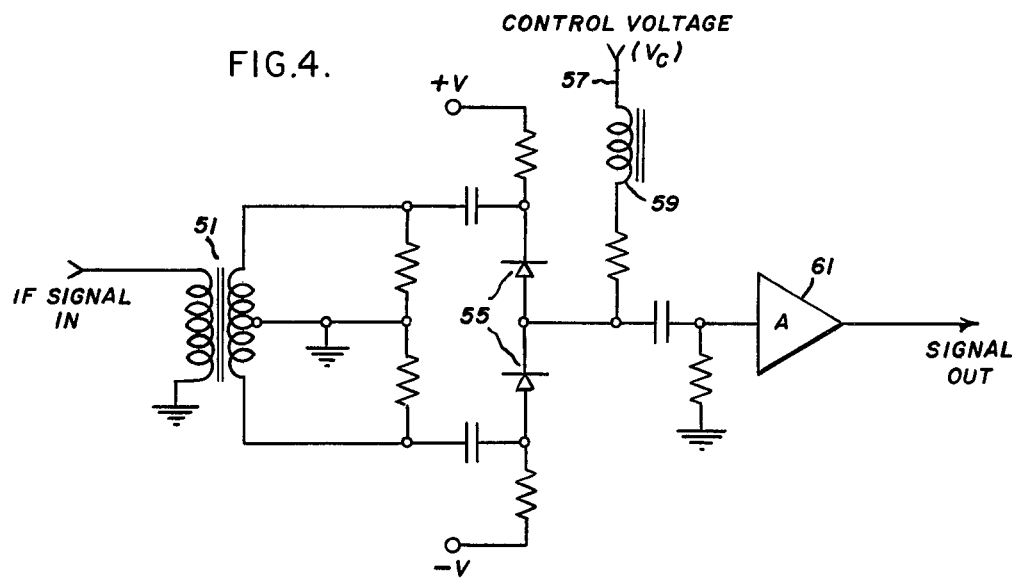
FIG. 4 is an elementary circuit diagram of one of the gain-controlled amplifiers useful in the AGC circuit of FIG. 1.

Referring now more specifically to details of this circuitry as illustrated in FIGS. 1, 3 and 4, the AGC amplifier 17 has as its input a continuous wave (CW) intermediate frequency reference signal input. This signal may conveniently be provided by a suitable stabilized local oscillator (not shown) generating an essentially constant frequency signal. The CW reference signal need not be coherent with the receiver IF signal nor need it be of identically the same frequency as the IF or meet any particular frequency stability requirement. The reference signal frequency preferably is close to the IF frequency, however, and it should be reasonably constant in amplitude since this signal provides a reference against which the sampled-noise signal is compared for gain control purposes.

Both the controlled-gain output of AGC amplifier 17 and the IF signal input on lead 11 are processed through matched detectors 19 each of which includes a diode 31 and low-pass filter 33 both of conventional type. As indicated, these detectors should be well matched so as to have as similar as possible operating characteristics over their required working ranges. It will be noted, however, that since the CW reference signal input normally is close to if not the same in frequency as the receiver IF and is of constant amplitude, there should be little detector difference error. Generally only negligibly small differentials in response will result from such factors as temperature variation or from variations in amplitude of the IF signal input and variations in frequency of the noise content of that signal.

The video signal output of the noise channel detector is sampled in the sample-hold gate 25 which preferably is synchronized with the radar pulse repetition rate in known manner. Typically the sample-hold switch drive is made responsive to the transmitter trigger pulse as generated by the radar system timing pulse generator, with some appropriate time delay so as to place the sampling interval as the desired point in the transmitter interpulse period, i.e., during the receive period, and of desired time duration. Thus in the exemplary embodiment being described, the sample-hold gate drive input to the sample-hold gate 25 was designed to place the sampling interval in the no target portion of the interpulse period, to hold the sample-hold gate open for approximately 10 microseconds, and to sample at the radar pulse repetition rate.

Because this sampling interval spans only a very small fraction of the radar interpulse period, only a very short interval of time is available in which to charge the storage capacitor conventionally used to hold the sampled signal through the period between samples. This makes desirable the use of a relatively small capacitor. However, because the period between samples here is a relatively long one, this makes desirable a relatively large capacitor. To reconcile these conflicting needs it may be desirable to use a two-stage sample-and-hold circuit. Such circuits, comprising a fast sample-and-hold followed by a slow sample-and-hold, with a smaller capacitor in the first being quickly charged and held sufficiently long to charge a larger capacitor in the second, are well known in the art and may be used here when helpful in obtaining the desired operation of the sample-hold circuit 25.

The sampled-noise signal thus derived and the gain controlled CW reference signal are applied as the two inputs to a difference amplifier 21. This difference amplifier provides the required gain and filtering to stabilize the AGC loop and to insure that the input to the CW reference signal detector tracks the IF input to the noise channel detector to within the tolerable error in amplitude and time response.

The difference voltage output of amplifier 21 is applied through the control amplifier 23 to AGC amplifier 17, and there acts to adjust the gain of the AGC amplifier so as to maintain the level of the CW reference signal at its output just equal to that of the sampled noise signal passed by the sample-hold gate 25. Further, the amplitude of the difference signal output of amplifier 21 provides a measure of the amplitude of the automatic gain control voltage necessary to maintain this relationship.

In this way it is possible to generate an AGC control voltage which provides a measure of any change in amplitude of the sampled-noise signal, and to accomplish the generation of such control voltage without need for interposing the sampling circuit directly within the AGC loop. Thus instead of adjusting the gain of an AGC amplifier operating on the sampled-data signal itself, to attempt to hold that signal constant as in conventional gain control loops, the AGC of the present invention adjusts the controlled amplifier gain in a manner to vary the CW reference signal amplitude as necessary to maintain it equal to the sampled-noise signal amplitude.

Examining more closely the nature of the AGC control voltage generated at the output of difference amplifier 21, it will be noted that if the gain of that amplifier is reasonably constant the control voltage which it generates will vary in exact proportion to the db change in the envelope of the amplitude modulation of the IF signal input to the detector in the sampled-noise channel. Therefore, within the AGC amplitude dynamic range, the control voltage output of difference amplifier 21 is directly related to the log of the modulation envelope of the IF signal input.

In fact, it may be noted that the circuit thus far described may be used as a true IF log detector, since it accepts an IF signal input and provides, as the output of difference amplifier 21, a linear function of the log of the input IF signal level. While the circuit thus lends itself to use as a general purpose IF log detector, it is not necessary for purposes of automatic gain control in accordance with the present invention that such log relationship be precisely maintained. Instead, what is desired is that there be a linear relationship between the control voltage output of difference amplifier 21 and the gain in db of AGC amplifier 17.

Figure 2:
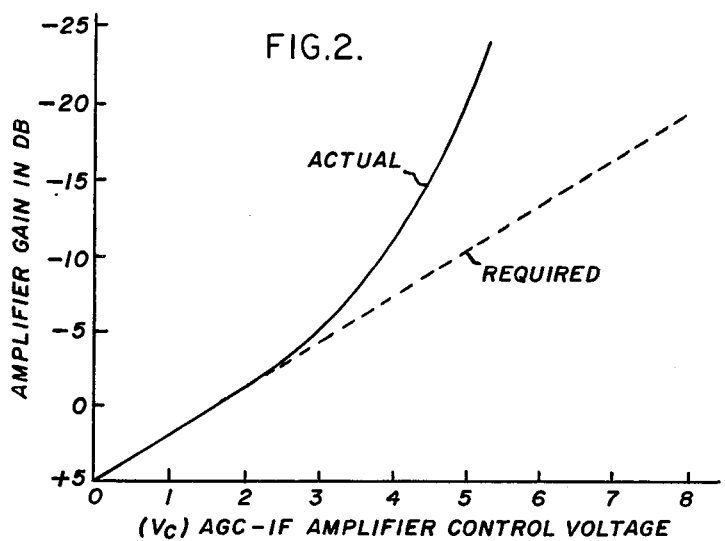
FIG. 2 is a curve illustrating an operational nonlinearity for which the linearizing network of FIG. 3 provides correction.

This is illustrated in FIG. 2, in which the actual gain (in db) of amplifier 17 is plotted against its control voltage input and shown to be a nonlinear function which departs substantially from the desired linear relationship shown in dotted line. Such linearized relationship is desirable because it greatly simplifies the task of constraining the IF and AGC amplifiers 13 and 17 to track their respective inputs identically, particularly since those inputs as applied to the two amplifiers must be inverted with respect to each other. Also, where the AGC control loop is used to provide control for more than a single IF amplifier channel, as it may readily be, the different channels all may be more easily made to track identically where the control voltage and the controlled amplifier response to it is precisely linear.

To provide such linearization of IF and AGC amplifier response to the difference amplifier output voltage, each of the control amplifiers 23 and 29 includes at 37, a nonlinear impedance network $Z_n$. This linearizing network 37 may take any of many known forms providing a voltage vs. attentuation characteristic which is complementary to the gain vs. voltage characteristic shown in FIG. 2. One such network which has been found suitable for this application is shown, in FIG. 3, as comprising a plurality of parallel-connected diode-resistor branches with each of the diodes 39 adjustably biased by a potentiometer 41 as necessary to warp the response function so as to achieve conformance to the required amplifier gain versus control voltage curve.

In addition to such linearization of the response characteristics of the IF and AGC amplifiers 13 and 17 it is necessary that their response curves be of identically the same slope and that there be no zero point offset between them. To enable adjustments of response curve slope and offset, the control amplifiers 23 and 29 include input level potentiometers 43 which provide gain adjustment, and input bias potentiometers 45 which provide offset adjustment. Additionally, the inverting amplifier 27 includes a similar bias control 49 for adjustment of offset of that amplifier. By proper setting of these various adjustments, together with proper design of the nonlinear impedance networks $Z_n$, it is possible to assure that the gains of the IF amplifier 13 and AGC amplifier 17 in response to the difference voltage output of difference amplifier 21 will be precisely equal and opposite over the entire operating range.

With reference now to FIG. 4, there is illustrated one possible circuit for effecting precise control of the gain of amplifiers 13 and 17 in response to their control voltage inputs. As illustrated, the IF signal input is applied across the primary of an input transformer 51 the secondary of which is center-tapped and connected in phase inverter configuration to apply oppositely phased outputs across two series-connected diodes 55. A biasing potential is maintained across these diodes by voltage sources as shown, the polarities of the diodes being such that they are reverse-biased.

The control voltage input ($V_c$) is applied on lead 57, through a choke 59 to remove any unwanted high frequency content, to the point of connection between the diodes 55. This same point of connection is capacitance-coupled to an amplifier stage 61 which provides the signal output. The two diodes 55 function as varactors, that is, as capacitances of value dependent upon the voltages respectively applied to them, which vary oppositely with the control voltage input ($V_c$) to the connection point between the diodes. The effect is to pass to amplifier 61 an input signal the level of which has been adjusted in conformance with the amplitude of control voltage ($V_c$), in accordance with the relationship previously explained.

Referring again to FIG. 1, the operation of the system as shown is believed obvious from what has already been said about the function of the various system elements hereinbefore described. The IF signal input and CW reference input are applied to the matched detectors 19, with the detector output in the IF signal channel being sampled and stored as a DC voltage proportional to noise amplitude in that channel during the sampling period. This sampled-noise signal is compared in the difference amplifier 21 with the detected CW reference signal and the difference signal output is fed back, with linearizing compensation by the network $Z_n$, to control the gain of the CW reference or AGC amplifier 17, thus completing the AGC loop.

The AGC voltage thus derived also is inverted and simultaneously applied to the input of the IF amplifier 13, with linearization in network $Z_n$ and with adjustment of the slope and offset controls as necessary to assure identity of tracking of the IF and AGC amplifiers 13 and 17. Accordingly, the change in db of attenuation in the IF amplifier 13 is controlled in direct accord with the change in db of background noise in the IF signal channel, and the desired AGC function is thus achieved. Further, since the AGC loop need not track the sampled-noise signal itself, but rather tracks the difference between that signal and an AGC controlled CW reference signal, it becomes possible to achieve desired sampling rates, sampling intervals and loop sampling times, all without compromise of AGC loop stability.

While in this description of the invention only one presently preferred embodiment has been illustrated and described by way of example, many modifications will occur to those skilled in the art and it therefore should be understood that the appended claims are intended to cover all such modifications as fall within the true spirit and scope of the invention.

What is claimed as new and desired to be secured by Letters Patent of the United States is:

1. For use in a pulse radar system, an automatic gain control circuit comprising:
   a. first and second controlled-gain amplifiers having similar control voltage versus gain characteristics;
   b. first and second IF signal sources, said first source applying a reference signal as the input to said first controlled-gain amplifier and said second source applying the radar received signal as the input to said second controlled-gain amplifier;
   c. first and second matched detectors, said first detector having as the input thereto the output of said first controlled-gain amplifier, and said second detector having as the input thereto said radar received signal;
   d. sample-and-hold circuit means for sampling the output of said second detector at a rate related to the radar pulse rate and holding the sampled output between samplings;
   e. a difference amplifier providing as its output a voltage varying in direct relation with the difference in outputs of said first detector and of said sample-and-hold circuit;
   f. an inverting amplifier having as its input the output of said difference amplifier; and
   g. first and second control amplifiers, said first control amplifier being connected to receive the output of said difference amplifier and to control said first controlled-gain amplifier in accordance therewith, said second control amplifier being connected to receive the output of said inverting amplifier and to control said second gain-controlled amplifier in accordance therewith.

2. An automatic gain control circuit as defined in claim 1, wherein each of said control amplifiers further comprises nonlinear impedance means for linearizing the response of said controlled-gain amplifiers to the output of said difference amplifier.

3. An automatic gain control circuit as defined in claim 1, wherein each of said control amplifiers further comprises varactor means variably biased by said difference amplifier output voltage so as to adjust the control amplifier gain in accordance with said voltage.

* * * * *